United States Patent
Shotter

(10) Patent No.: US 10,826,208 B1
(45) Date of Patent: Nov. 3, 2020

(54) SENSOR WITH INTEGRATED ELECTRICAL CONTACTS

(71) Applicant: Superior Sensor Technology, Saratoga, CA (US)

(72) Inventor: Timothy Allen Shotter, San Jose, CA (US)

(73) Assignee: Superior Sensor Technology, Saratoga, CA (US)

( * ) Notice: Subject to any disclaimer, the term of this patent is extended or adjusted under 35 U.S.C. 154(b) by 134 days.

(21) Appl. No.: 15/883,448

(22) Filed: Jan. 30, 2018

Related U.S. Application Data

(60) Provisional application No. 62/452,002, filed on Jan. 30, 2017, provisional application No. 62/512,330, filed on May 30, 2017, provisional application No. 62/526,542, filed on Jun. 29, 2017.

(51) Int. Cl.
| | | |
|---|---|---|
| *H01R 12/70* | (2011.01) | |
| *H05K 1/11* | (2006.01) | |
| *H05K 1/18* | (2006.01) | |
| *H01R 12/71* | (2011.01) | |
| *H01R 12/72* | (2011.01) | |
| *H01R 13/24* | (2006.01) | |
| *H01R 43/26* | (2006.01) | |
| *G01D 11/24* | (2006.01) | |

(52) U.S. Cl.
CPC ....... *H01R 12/7017* (2013.01); *G01D 11/245* (2013.01); *H01R 12/7076* (2013.01); *H01R 12/714* (2013.01); *H01R 12/725* (2013.01); *H01R 13/2407* (2013.01); *H01R 43/26* (2013.01); *H05K 1/111* (2013.01); *H05K 1/181* (2013.01); *H01R 12/7023* (2013.01); *H01R 12/7029* (2013.01); *H01R 12/7047* (2013.01); *H01R 12/7052* (2013.01); *H05K 2201/09409* (2013.01); *H05K 2201/10151* (2013.01); *H05K 2201/10409* (2013.01)

(58) Field of Classification Search
CPC ...... G01D 11/24; G01D 11/245; H01R 12/51; H01R 12/55; H01R 12/58; H01R 12/585; H01R 12/7011; H01R 12/7017; H01R 12/7023; H01R 12/7076; H01R 13/42; H01R 13/627; H01R 13/6278; H05K 1/181
USPC ........................................ 73/31.05, 431, 756
See application file for complete search history.

(56) References Cited

U.S. PATENT DOCUMENTS

| | | | | |
|---|---|---|---|---|
| 4,089,575 A | * | 5/1978 | Grabbe ................ | H05K 7/1046 174/536 |
| 4,838,089 A | * | 6/1989 | Okada ................ | G01L 19/0038 338/4 |

(Continued)

*Primary Examiner* — Benjamin R Schmitt
(74) *Attorney, Agent, or Firm* — Rimon Law

(57) ABSTRACT

A PCB mountable sensor having spring electrical contacts and mechanical attachment means is provided. In use, the spring contacts mate with exposed pads on a target PCB to form an electrical interface therebetween. The attachment means releasably secures the sensor to the PCB against the force of the spring contacts. The attachment means can be, for example, an adapter that fits like a collar around the sensor, or can be integral with the sensor. The design of the sensor provides interchangeability with no or limited tools, no PCB resident connectors, and no potential damage to the PCB upon rework or replacement.

10 Claims, 5 Drawing Sheets

(56) References Cited

U.S. PATENT DOCUMENTS

| | | | | |
|---|---|---|---|---|
| 5,648,615 A | * | 7/1997 | Jeske | G01D 11/245 |
| | | | | 73/756 |
| 5,745,347 A | * | 4/1998 | Miller | B60R 21/01 |
| | | | | 361/807 |
| 6,170,332 B1 | * | 1/2001 | MacDonald | B81C 1/00619 |
| | | | | 73/514.32 |
| 2012/0289076 A1 | * | 11/2012 | Wolff | H05K 3/301 |
| | | | | 439/345 |

* cited by examiner

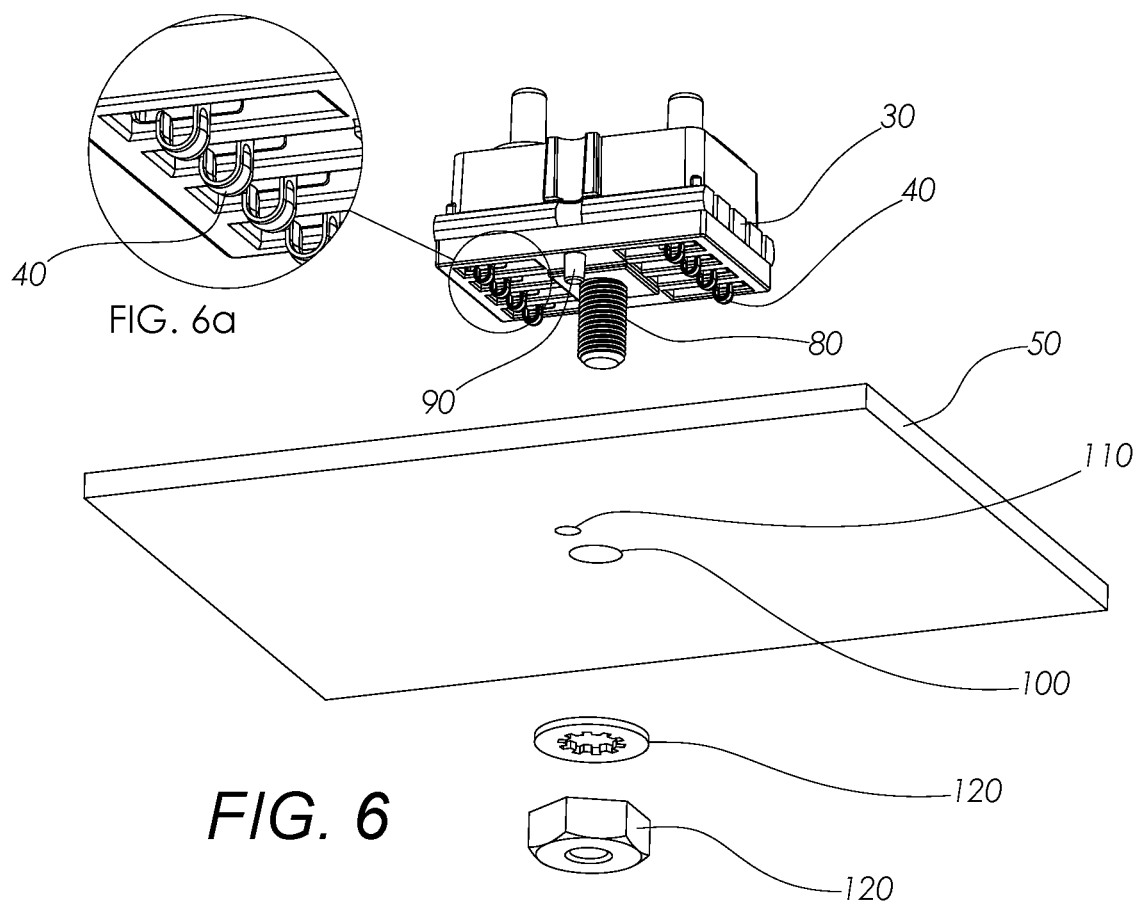
FIG. 6a
FIG. 6
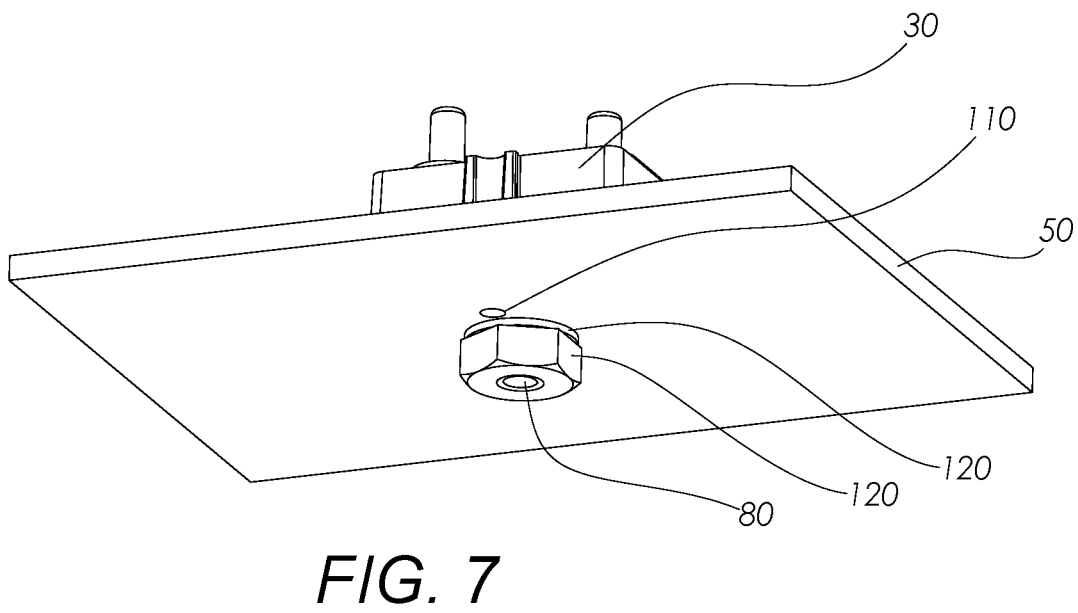
FIG. 7

SENSOR WITH INTEGRATED ELECTRICAL CONTACTS

CROSS-REFERENCE TO RELATED APPLICATIONS

This application claims priority to U.S. Provisional Patent Application No. 62/452,002 filed on Jan. 30, 2017, as well as to U.S. Provisional Patent Application No. 62/512,330 filed on May 30, 2017, and to U.S. Provisional Patent Application No. 62/526,542 filed on Jun. 29, 2017 each of which is incorporated herein by reference.

BACKGROUND OF THE INVENTION

Field of the Invention

The present invention is in the field of electronic sensing devices, and more particularly, in the field of sensing devices with simplified and versatile means of electrical interconnection.

Related Art

Conventional sensors such as surface mount or through hole sensors are well known in the art. These sensors are affixed to a target Printed Circuit Board ("PCB") by soldering and require a de-soldering process for removal. Typical soldering methods of wave soldering or reflow soldering expose the sensors to high temperatures, corrosive gases and a subsequent cleaning process which often uses corrosive agents for cleaning, any of which can cause harm to the sensing element of the sensor. It is often required to use a more expensive hand operation for soldering the sensor to the PCB with subsequent hand cleaning to avoid sensor damage.

Removal and replacement of such a sensor from a PCB also requires a de-soldering and soldering process which renders sensor replacement in the field unpractical and forces depot level servicing. Also, this replacement process risks damaging the PCB, rendering it scrap along with the often other very expensive components on the PCB.

Also well known are sensors with mechanical mounting means with an integrated connector, or integrated cable with a connector. These sensors can be mounted after the PCB assembly process and can be constructed in a way that favors field replacement, however, this solution is larger, more complicated, and more expensive due to the added connector and cabling.

SUMMARY OF THE INVENTION

The present invention provides a sensor device with spring electrical contacts (a contact sensor herein) and some mechanical attachment means, where the spring contacts form an electrical interface by mating with exposed pads on a target PCB. The attachment means holds the housing of the sensor to the PCB against the force of the spring contacts. The attachment means releasably attaches the housing to the PCB and can be, for example, an adapter that fits like a collar around the sensor housing, or can be integral with the housing. In an illustrative embodiment a snap-in-place adapter engages with the sensor housing and provides ease of assembly by including snap-fit tabs (the illustrations showing a cantilever hook as one example) that engage with mating holes on the PCB. In another illustrative embodiment the sensor housing includes a threaded feature for attachment to the PCB. The present invention thus provides a PCB mountable sensor with an electrical interface to the PCB which allows interchangeability with no or limited tools, no PCB resident connectors, and no potential damage to the PCB upon rework or replacement.

An exemplary sensor of the present invention comprises a housing, a sensing element disposed within the housing, a plurality of electrical spring contacts, and mechanical attachment means for releasably attaching the housing to a PCB. The plurality of electrical spring contacts project from an exterior side of the housing, and the electrical spring contacts are electrically connected to the sensing element. When the sensor is engaged with the PCB by the mechanical attachment means, the electrical spring contacts of the sensor make contact with corresponding contact pads on the PCB. In various embodiments, the sensing element includes a pressure sensor or a gas sensor. The electrical spring contacts are gold plated, in different embodiments. The sensor housing can also include a pair of gas ports, in some embodiments, and the mechanical attachment means in these embodiments comprises an adapter piece engaged with the housing, wherein the adapter piece includes a pair of gas ports engaged with the gas ports of the sensor housing.

In some embodiments of the sensor the mechanical attachment means is itself releasably detachable from the sensor. For example, the mechanical attachment means can comprise an adapter piece engaged with the housing, where the adapter piece includes a snap-fit tab configured to hook into a mating hole of the PCB. In some of these embodiments the adapter piece is further configured to slide onto a side of the PCB in order to releasably attach the exterior side of the housing to a PCB. The adapter piece can include a snap-fit tab to releasably engage with the PCB, in some of these embodiments.

In further embodiments, the mechanical attachment means is integral with the housing. In some of these embodiments the mechanical attachment means comprises a snap-fit tab projecting from the exterior side of the housing and configured to hook into a mating hole of the PCB. The mechanical attachment means can also comprise a threaded bolt projecting from the exterior side of the housing, or a threaded receptacle to receive a bolt through the PCB. In some of these latter embodiments, the mechanical attachment means can further comprise an alignment pin projecting from the exterior side of the housing.

The present invention is also directed to a PCB comprising an array of contact pads and a sensor releasably attached to the PCB. In these embodiments, the sensor includes a housing, a sensing element disposed within the housing, a plurality of electrical spring contacts, and mechanical attachment means releasably attaching the exterior side of the housing to a PCB. The plurality of electrical spring contacts project from an exterior side of the housing, and the electrical spring contacts are electrically connected to the sensing means. Further, each of the spring contacts is under a compressive load and in contact with a corresponding contact pad of the array of contact pads.

In various embodiments of this exemplary PCB, the PCB further comprises a mating hole and the mechanical attachment means includes an adapter piece engaged with the housing, where the adapter piece includes a snap-fit tab hooked into the mating hole. In other embodiments, the PCB further comprises a mating hole and the mechanical attachment means includes a threaded bolt projecting from the exterior side of the housing and through the mating hole and secured to the PCB with a threaded nut attached to the threaded bolt. In still other embodiments, the PCB further comprises a mating hole and the mechanical attachment means includes a threaded receptacle as part of the housing. In these embodiments the threaded bolt is disposed through the mating hole and engaged with the threaded receptacle to secure the PCB to the sensor housing.

The present invention is further directed to methods for replacing sensors on PCBs that can be performed, for example, in the field. An exemplary method comprises detaching a first sensor from a PCB then mechanically attaching a second sensor to the PCB where the first sensor had been. In various embodiments, the step of detaching the first sensor can be performed without use of de-soldering. The step of detaching the first sensor can also include decoupling a snap fit feature of the first sensor from the PCB.

In various embodiments of the method, mechanically attaching the second sensor to the PCB includes attaching an adapter piece to the second sensor. Mechanically attaching the second sensor to the PCB can include threading a nut onto a bolt, where the bolt is part of the sensor, or where the bolt is disposed through a mating hole in the PCB and engaged with a threaded receptacle of the sensor. Mechanically attaching the second sensor to the PCB can alternatively include coupling a snap fit feature of the second sensor to a mating hole of the PCB.

BRIEF DESCRIPTION OF THE DRAWINGS

FIG. 2 is an exploded bottom perspective view of the integrated contact sensor device of FIG. 1, while FIG. 2a is an enlarged view of the circled region 2a.

FIG. 6 is an exploded bottom perspective view of the integrated contact sensor device of FIG. 5, while FIG. 6a is an enlarged view of the circled region 6a.

FIG. 7 is a bottom perspective view of the integrated contact sensor device of FIG. 5.

DETAILED DESCRIPTION OF THE INVENTION

Figure 1:
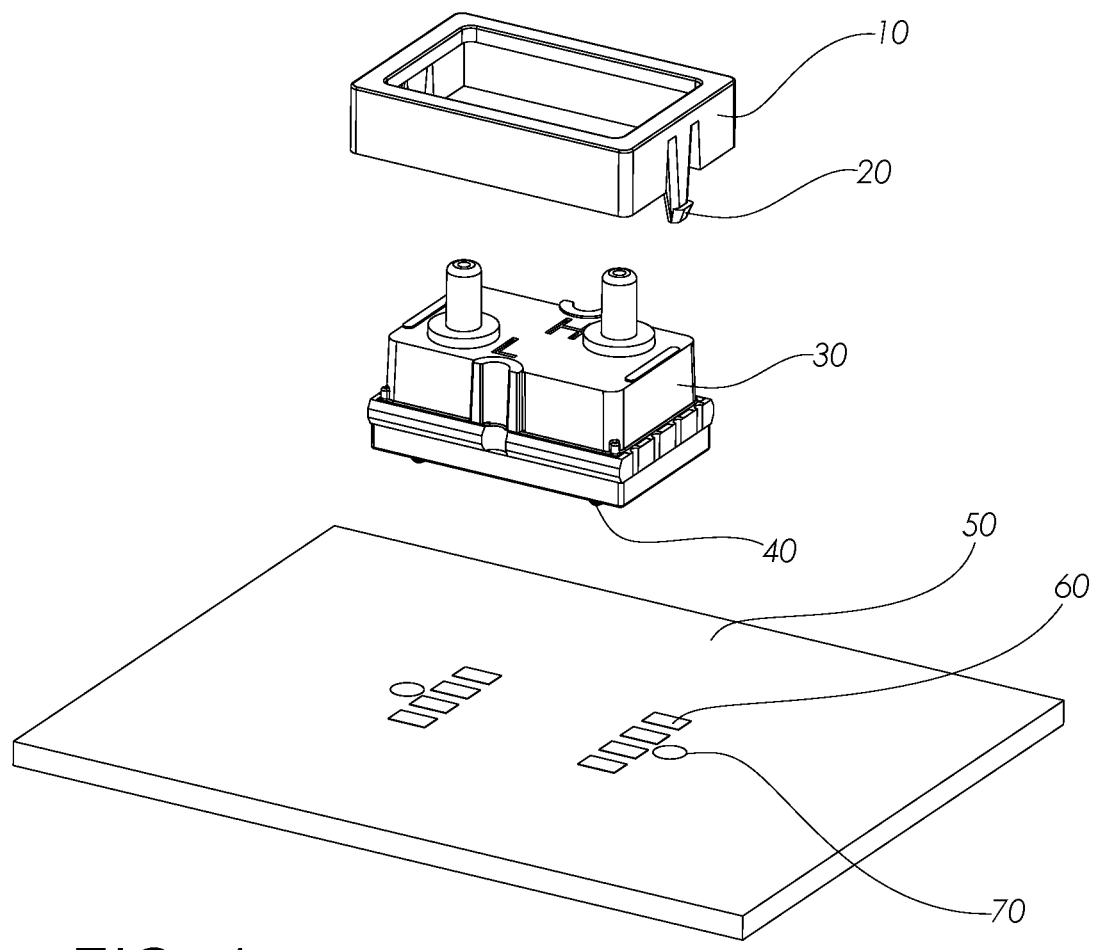
FIG. 1 is an exploded top perspective view of an integrated contact sensor device, according to an exemplary embodiment of the present invention, having an adapter piece for the purpose of snap-fitting the sensor onto a PCB.
Figure 2:
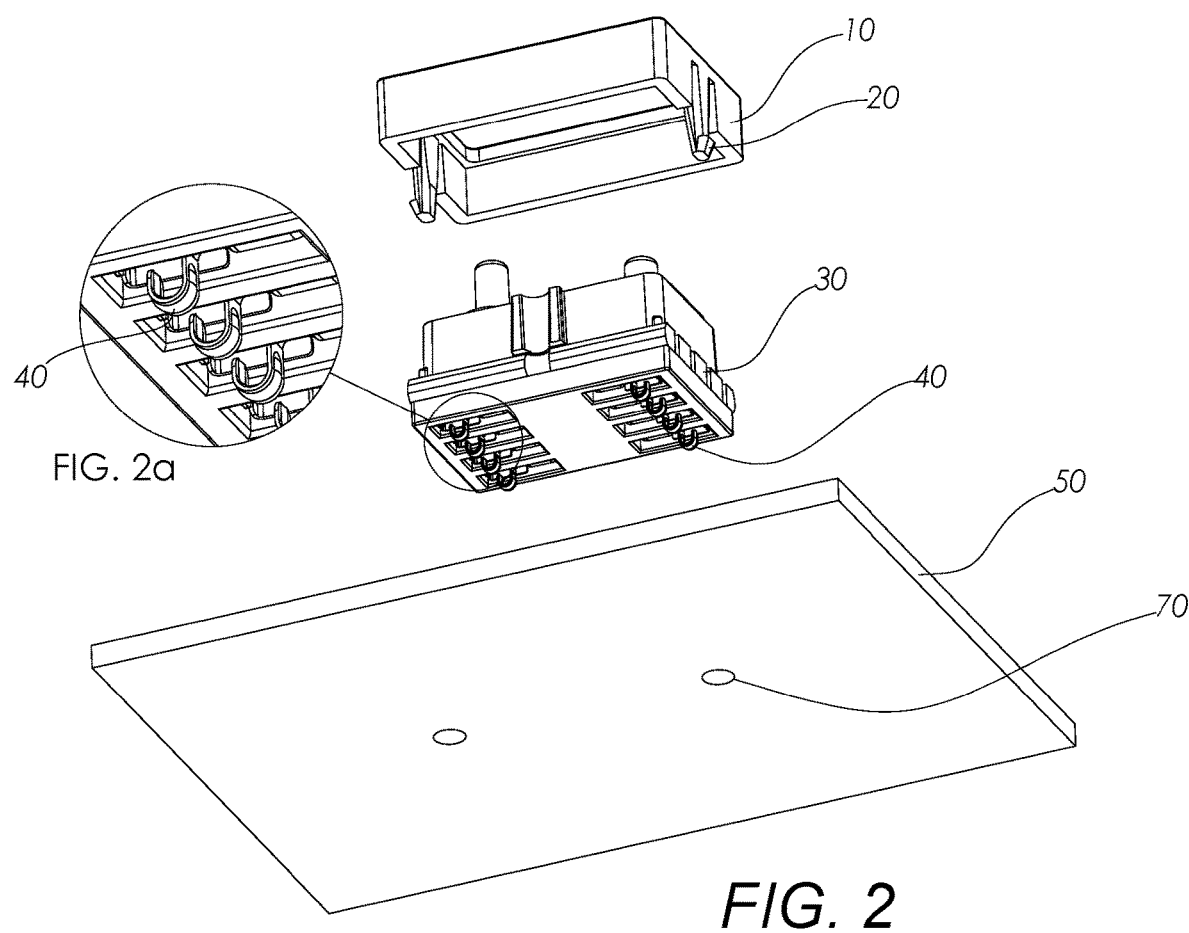
Figure 3:
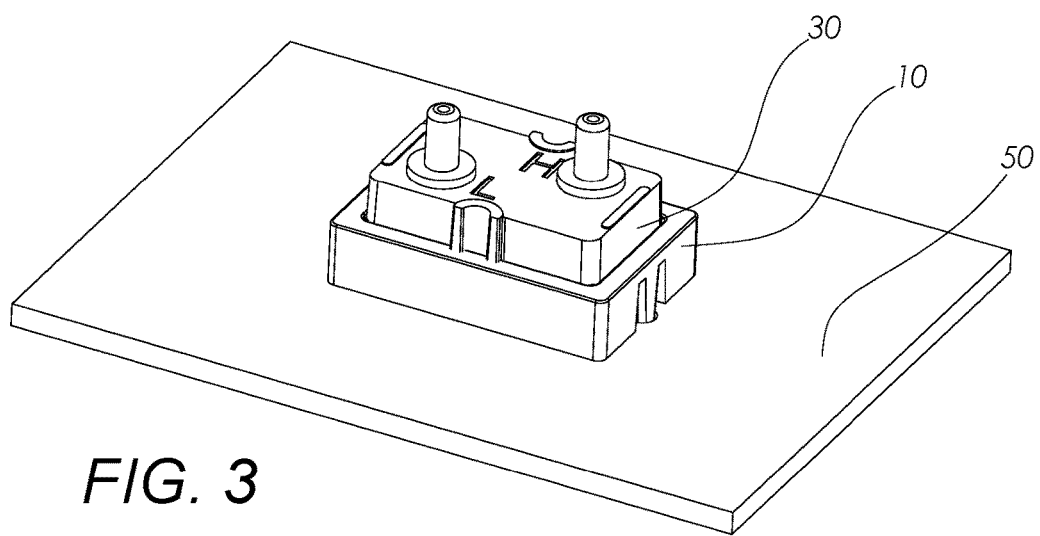
FIG. 3 is a top perspective view of the integrated contact sensor device of FIG. 1.
Figure 4:
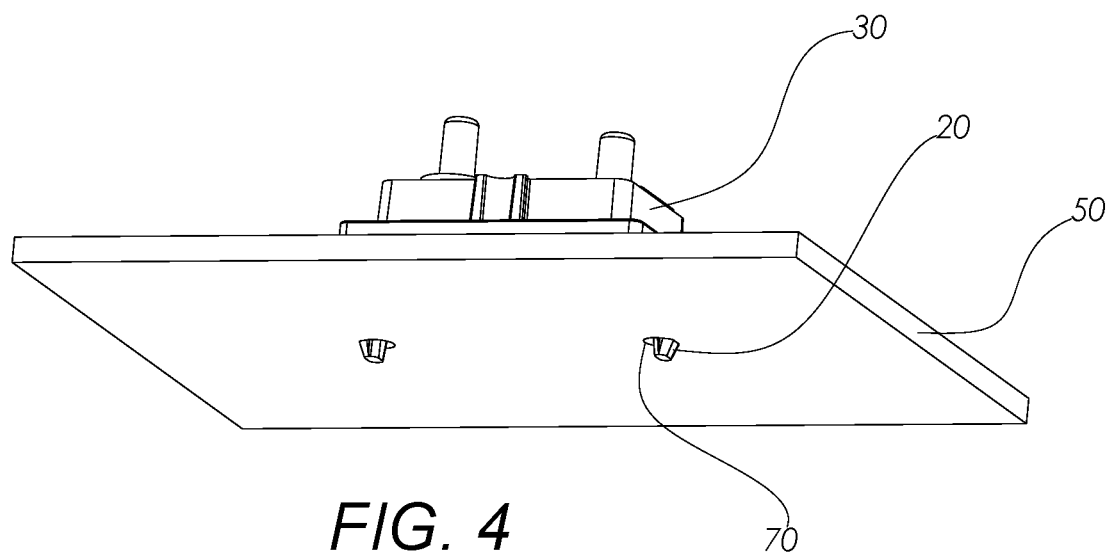
FIG. 4 is a bottom perspective view of the integrated contact sensor device of FIG. 1.
Figure 5:
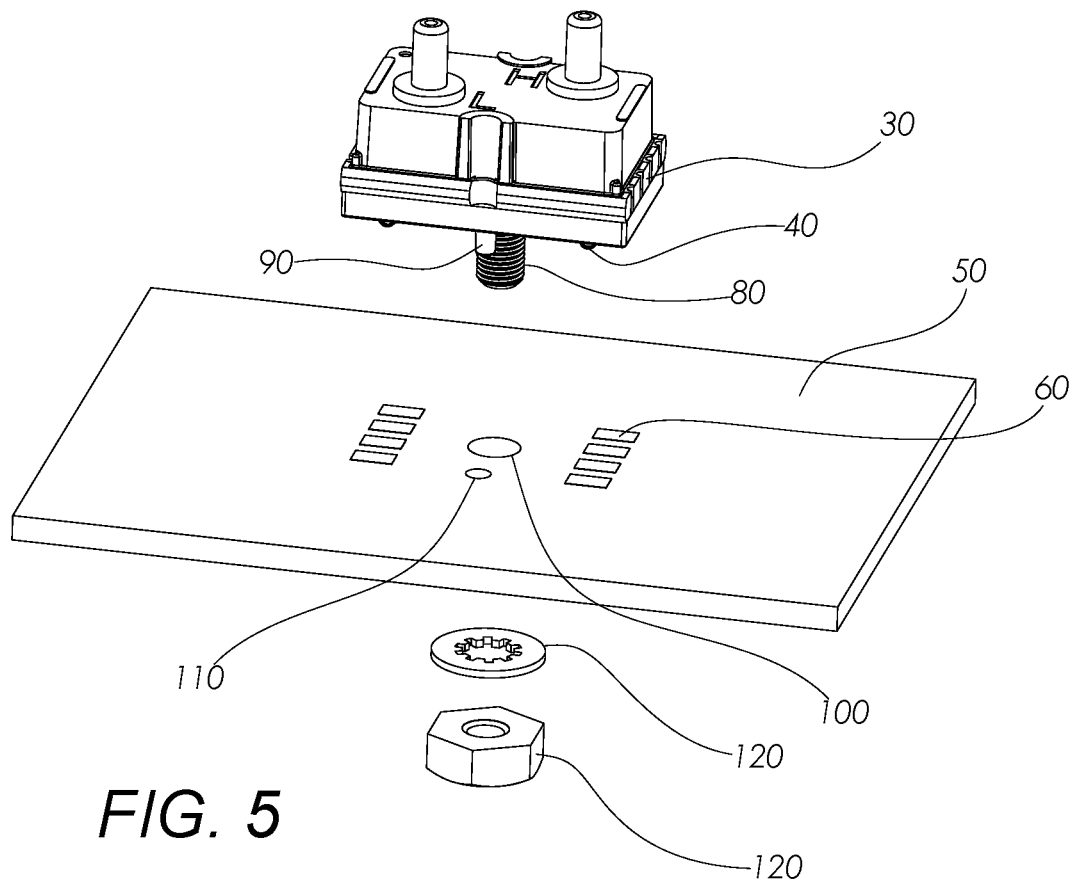
FIG. 5 is an exploded top perspective view of an integrated contact sensor device, according to an exemplary embodiment of the present invention, including an integrated screw mount feature for mechanical attachment onto a PCB.

Referring now to FIGS. 1-4, these illustrate a sensor 30 with integrated spring contacts 40, a snap fit adapter piece 10 and a receiving PCB 50. The receiving PCB 50 includes contact pads 60 which mate with the integrated spring contacts 40 to form electrical connections between the sensor 30 and the receiving PCB 50. The receiving PCB 50 also includes snap fit mating holes 70 which receive the snap fit features 20. As used herein, an electrical spring contact refers to an electrically conductive member that constitutes a spring, where spring is used according to its normal meaning, namely "a resilient device that can be compressed but returns to its former shape when released." As such, it will be understood that a spring contact cannot be a solder bump or a contact pad.

In further detail, still referring to the invention of FIGS. 1-4, once the snap fit feature 20 is engaged with the PCB snap fit mating holes 70, the sensor 30 is held in place while maintaining a suitable mating contact force between the integrated spring contacts 40 and the PCB contact pads 60. The size and resultant retaining force capability of the snap fit feature 20 depend upon the number of integrated spring contacts 40 and their individual spring force plus, depending on the type of sensor 30, any additional force which may add to the snap fit feature 20. Other forces can be due to the connecting tubing in the case of a pressure sensor. In the case of a gas sensor, there may or may not be such tubing. The individual integrated spring contact force depends upon the required current carrying capacity and desired contact resistance. For typical sensor applications, a contact force of 0.2 to 1.2 N is suitable.

Compatible contact mating materials is also a consideration. The integrated spring contacts 40 and the PCB contact pads 60 require compatible materials or plating for good electrical connection. One such material is gold plating for both the integrated spring contacts 40 and the PCB contact pads 60. For the PCB contact pads 60, as can be provided by electroless plating, such as by ENIG or ENEPIG, which both provide an immersion gold finish and are but two of multiple such readily available and commonly used PCB manufacturing finishes.

A further consideration is the size of the PCB contact pads 60 which should allow for position tolerance of the integrated spring contacts 40 as well as the alignment tolerances of the mechanical fastening, as in this illustrative embodiment, the alignment tolerances of the snap fit feature 20 and the PCB snap fit mating holes 70.

Additionally, this illustrative embodiment shows the snap fit adapter piece 10 as a separate piece. It is also possible to include the snap fit feature 20 as an integral part of the sensor 30 housing depending on the tooling reusability and other component combination considerations.

Referring now to the embodiment shown in FIGS. 5-8, a receiving PCB 50 engages with a sensor 30 having integrated spring contacts 40, an integrated screw mount feature 80, and an alignment pin 90. The receiving PCB 50 includes contact pads 60 which mate with the integrated spring contacts 40 to form electrical connections between the sensor 30 and the receiving PCB 50. The receiving PCB 50 also includes a mating screw hole 100 which receives the screw mount feature 80 and further includes as a mating alignment hole 110 which in combination serve to correctly align the sensor 30 to the receiving PCB 50. The mounting hardware 120 serves to affix the sensor 30 to the receiving PCB 50. It will be appreciated that the mechanical attachment means described here is reversible such that the sensor housing includes a threaded receptacle such as a through-hole, recess, or nut so a bolt can be inserted through the receiving PCB 50 and engage with the receptacle of the sensor housing.

Figure 8:
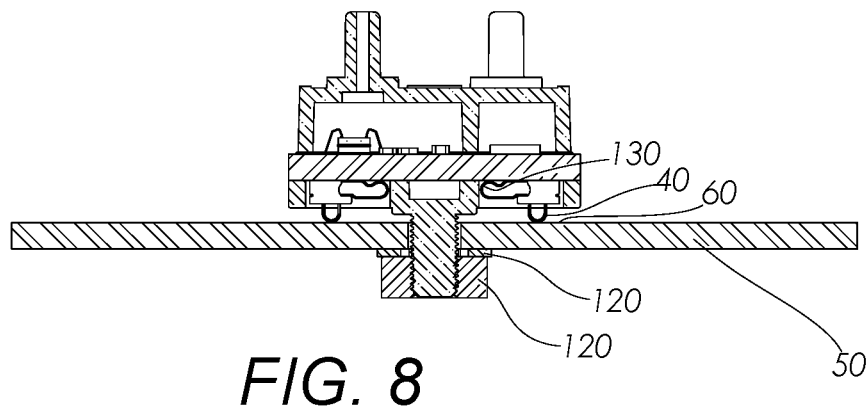
FIG. 8 is a simplified cross section view of the integrated contact sensor device of FIG. 5 showing the sensor contacts just contacting the PCB pad surface to form an electrical connection.

FIG. 8 illustrates the integrated spring contacts 40 as they initially contact the contact pads 60 of the receiving PCB 50. The integrated spring contacts 40 themselves have a natural point of flexure 130 as the sensor 30 and the receiving PCB 50 are brought closer together.

Additionally, in the embodiment of FIGS. 5-8, the sensor 30 is a pressure sensor, however it will be appreciated that many other forms or types of sensors which benefit from the features of this embodiment.

Furthermore, the illustrative embodiment of FIGS. 5-8 includes only one integrated screw mount feature 80. However, depending on the size, weight and desired stress locations, for instance, it can be desirable to include more than one of the screw mount feature 80. Further, the snap fit adapter piece 10 can also include threaded features such as the screw mount feature 80 on either side, in place of the snap fit feature 20.

The advantages of the present invention include, without limitation, a means to easily attach and detach a sensor from a PCB and embodiments of the invention make it is easy to attach a sensor to a PCB even after the harsh manufacturing environment of the PCB. Rework at the point of manufacture likewise does not introduce a risk of damage to the PCB and therefore reduces the cost associated with the manufacture of the PCB assembly. Embodiments of the invention also renders field service possible at the sensor component level, and can therefore make service sessions more time efficient thus reducing service costs. The present invention also provides a size advantage since the interconnections are within the footprint of the sensor itself. Additionally, there are no additional components required for the electrical connection other than the PCB itself which is already a required element in a PCB mountable sensor.

Figure 9:
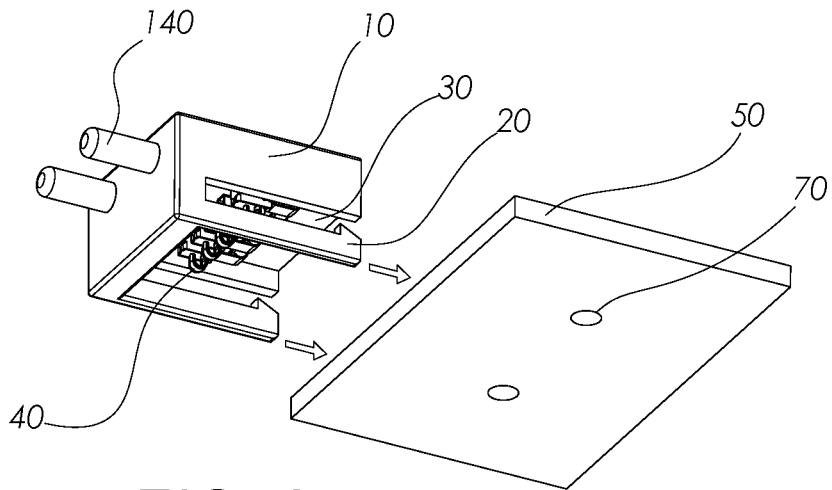
FIGS. 9 and 10 are bottom perspective views of an integrated contact sensor device, according to an exemplary embodiment of the present invention, having an adapter piece that engages with a PCB by sliding onto the PCB from a side thereof, respectively shown prior to engaging with the PCB and after engaging with the PCB.
Figure 10:
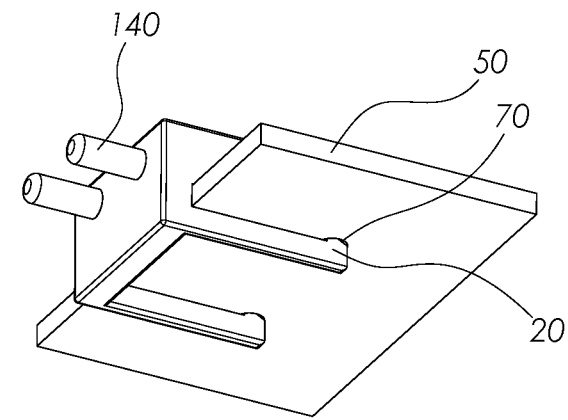

FIG. 9 is a bottom perspective view of an integrated contact sensor device having a snap fit adapter piece 10 that slides onto the receiving PCB 50 from a side thereof. In this exemplary embodiment the snap fit adapter piece 10 releasably engages with the sensor housing 30 and includes snap fit features 20 to releasably engage with the snap fit mating holes 70 in the receiving PCB 50. The snap fit adapter piece 10 in this embodiment also provides a pair of gas ports 140 that engage with the sensor's gas ports when the snap fit adapter piece 10 engages with the sensor 30. It should be noted that instead of having an additional snap fit adapter piece 10, depending on the tooling reusability and other component combination considerations, the sensor 30 can be constructed with the features of the snap fit adapter piece 10 as a single integrated device.

The embodiments discussed herein are illustrative of the present invention. As these embodiments are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

The use of the term "means" within a claim of this application is intended to invoke 112(f) only as to the limitation to which the term attaches and not to the whole claim, while the absence of the term "means" from any claim should be understood as excluding that claim from being interpreted under 112(f). As used in the claims of this application, "configured to" and "configured for" are not intended to invoke 112(f).

The invention claimed is:

1. A sensor comprising:
   a housing;
   a sensing element enclosed within the housing;
   a plurality of electrical spring contacts projecting from an exterior side of the housing, the electrical spring contacts being electrically connected to the sensing element; and
   mechanical attachment means for releasably attaching the housing to a PCB, the mechanical attachment means comprising an adapter piece engaged with the housing, the adapter piece including a snap-fit tab configured to hook into a mating hole of the PCB.

2. The sensor of claim 1 wherein the sensing element includes a pressure sensor or gas sensor.

3. The sensor of claim 1 wherein the electrical spring contacts are gold plated.

4. The sensor of claim 1 wherein the mechanical attachment means is integral with the housing.

5. The sensor of claim 1 wherein the adapter piece is configured to slide onto a side of the PCB.

6. The sensor of claim 1 wherein the sensor housing includes a pair of gas ports and the adapter piece includes a pair of gas ports engaged with the gas ports of the sensor housing.

7. A PCB comprising:
   an array of contact pads; and
   a sensor releasably attached to the PCB, the PCB including a mating hole, the sensor including
      a housing,
      a sensing element enclosed within the housing, and
      a plurality of electrical spring contacts projecting from an exterior side of the housing, the electrical spring contacts being electrically connected to the sensing element, each of the spring contacts being in contact with a corresponding contact pad of the array of contact pads; and
   mechanical attachment means releasably attaching the exterior side of the housing to a PCB, the mechanical attachment means including an adapter piece engaged with the housing, the adapter piece including a snap-fit tab hooked into the mating hole.

8. A method comprising:
   detaching a first sensor from a PCB without use of de-soldering; then
   mechanically attaching a second sensor to the PCB where the first sensor had been, including making electrical connections between contact pads on the PCB and a plurality of electrical spring contacts projecting from an exterior side of the second sensor, wherein mechanically attaching the second sensor to the PCB includes coupling a snap fit feature of the second sensor to a mating hole of the PCB and places the electrical spring contacts under a compressive load.

9. The method of claim 8 wherein mechanically attaching the second sensor to the PCB includes attaching an adapter piece to the second sensor.

10. The method of claim 8 wherein mechanically detaching the first sensor from the PCB includes decoupling a snap fit feature of the first sensor from the PCB.

* * * * *